US012763786B2

(12) United States Patent
Park et al.

(10) Patent No.: US 12,763,786 B2
(45) Date of Patent: Oct. 13, 2026

(54) DIRECT CURRENT OFFSET CALIBRATION FOR DIGITAL-TO-ANALOG CONVERSION

(71) Applicant: QUALCOMM Incorporated, San Diego, CA (US)

(72) Inventors: Beomsoo Park, San Diego, CA (US); Ashok Swaminathan, Cardiff, CA (US); Negar Rashidi, Mission Viejo, CA (US)

(73) Assignee: Qualcomm Incorporated, San Diego, CA (US)

(*) Notice: Subject to any disclaimer, the term of this patent is extended or adjusted under 35 U.S.C. 154(b) by 156 days.

(21) Appl. No.: 18/746,894

(22) Filed: Jun. 18, 2024

(65) Prior Publication Data

US 2025/0385682 A1 Dec. 18, 2025

(51) Int. Cl.
*H03M 1/10* (2006.01)

(52) U.S. Cl.
CPC .................................. *H03M 1/1014* (2013.01)

(58) Field of Classification Search
CPC ...... H03M 1/1014; H03M 1/742; H03M 3/43; H03M 1/1023
See application file for complete search history.

(56) References Cited

U.S. PATENT DOCUMENTS

| | | | | |
|---|---|---|---|---|
| 7,379,002 | B1 * | 5/2008 | Zhixu | H03M 3/392 341/143 |
| 8,593,325 | B2 * | 11/2013 | Wong | H03M 1/46 327/535 |
| 9,118,339 | B2 * | 8/2015 | Shrivastava | H03M 1/12 |
| 9,866,238 | B1 * | 1/2018 | Thomsen | H03M 3/422 |
| 9,991,899 | B2 * | 6/2018 | Chandra | H03M 1/0624 |
| 10,020,817 | B1 * | 7/2018 | Zhang | H03M 3/38 |
| 10,230,386 | B2 * | 3/2019 | Ding | H03M 1/466 |
| 10,516,406 | B1 * | 12/2019 | Kuttner | H03M 1/0845 |
| 10,516,412 | B1 * | 12/2019 | Mehdizad Taleie | H03M 1/662 |
| 10,530,340 | B1 * | 1/2020 | Young | H03H 17/0664 |
| 10,644,718 | B1 * | 5/2020 | Wang | H04B 1/0021 |
| 10,763,881 | B1 * | 9/2020 | Nittala | H03M 1/1014 |
| 10,812,094 | B2 | 10/2020 | Huang et al. | |
| 10,848,167 | B1 * | 11/2020 | Far | G06F 7/5443 |
| 11,184,018 | B1 * | 11/2021 | Liu | H03K 5/1565 |
| 11,539,371 | B1 * | 12/2022 | Tang | H03M 1/1061 |
| 12,381,572 | B2 * | 8/2025 | Fei | H03M 1/742 |
| 12,431,911 | B1 * | 9/2025 | Mellati | H03M 1/1014 |

(Continued)

OTHER PUBLICATIONS

International Search Report and Written Opinion—PCT/US2025/030139—ISA/EPO—Aug. 20, 2025.

(Continued)

*Primary Examiner* — Lam T Mai
(74) *Attorney, Agent, or Firm* — Gerald P. Joyce, III

(57) ABSTRACT

Certain aspects of the present disclosure provide techniques and apparatus for digital-to-analog conversion. An example apparatus generally includes a digital-to-analog converter (DAC), an incremental analog-to-digital converter (IADC) having a first input coupled to a first output of the DAC, and a controller coupled to the DAC and the IADC. The controller is configured to determine a direct current (DC) offset associated with the DAC using the IADC and control a mission-mode digital input signal of the DAC based on the DC offset.

20 Claims, 10 Drawing Sheets

(56) References Cited

U.S. PATENT DOCUMENTS

2002/0132597 A1* 9/2002 Peterzell ................ H03D 3/009
455/67.11
2005/0052301 A1* 3/2005 Mills ................... H03M 1/0643
341/144
2011/0006934 A1* 1/2011 Katsis ..................... H03M 1/70
341/137
2011/0249710 A1* 10/2011 Chou ................... H04B 1/0003
375/219
2012/0249348 A1* 10/2012 Siragusa ............. H03M 1/1009
341/110
2019/0207616 A1* 7/2019 Chen ................... H03M 1/1014
2021/0143827 A1* 5/2021 Huynh ................ H03M 1/0854
2021/0175894 A1* 6/2021 Melanson ............. H03M 3/374
2023/0046938 A1* 2/2023 Fröhlich ................. H03M 1/46
2023/0097708 A1* 3/2023 Mahmoudidaryan ........................
H03M 1/661
341/144
2023/0138427 A1* 5/2023 García González .........................
H03M 1/1038
341/155
2023/0378972 A1* 11/2023 Lin .......................... G09G 3/32
2023/0403022 A1* 12/2023 Zhou ................... H03M 1/1009

OTHER PUBLICATIONS

Tseng W-H., et al., "A 960MS/s DAC with 80dB SFDR in 20nm CMOS for Multi-Mode Baseband Wireless Transmitter", 2014 Symposium on Vlsi Circuits Digest of Technical Papers, IEEE, Jun. 10, 2014, 2 Pages, XP032622366, figures 1-6 p. 1-p. 2.

* cited by examiner

DIRECT CURRENT OFFSET CALIBRATION FOR DIGITAL-TO-ANALOG CONVERSION

TECHNICAL FIELD

Certain aspects of the present disclosure generally relate to electronic circuits and, more particularly, to techniques for digital-to-analog conversion.

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, Fifth Generation (5G) New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more digital-to-analog converters (DACs).

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include increased digital-to-analog conversion accuracy.

Certain aspects of the present disclosure provide an apparatus for digital-to-analog conversion. The apparatus generally includes a digital-to-analog converter (DAC), an incremental analog-to-digital converter (IADC) having a first input coupled to a first output of the DAC, and a controller coupled to the DAC and the IADC, wherein the controller is configured to determine a direct current (DC) offset associated with the DAC using the IADC and control a mission-mode digital input signal of the DAC based on the DC offset.

Certain aspects of the present disclosure provide a method for digital-to-analog conversion. The method generally includes: generating, via a DAC, a first output current based on a calibration-mode digital input signal; generating, via an IADC, a first digital output signal based on the first output current; determining a DC offset associated with the DAC based on the first digital output signal; and adjusting a mission-mode digital input signal for the DAC based on the DC offset.

Certain aspects of the present disclosure provide an apparatus for digital-to-analog conversion. The apparatus generally includes: a DAC including a first output and a second output; and an IADC including a switch circuit, a first input selectively coupled to the first output of the DAC or the second output of the DAC via the switch circuit, and a second input selectively coupled to the first output of the DAC or the second output of the DAC via the switch circuit.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
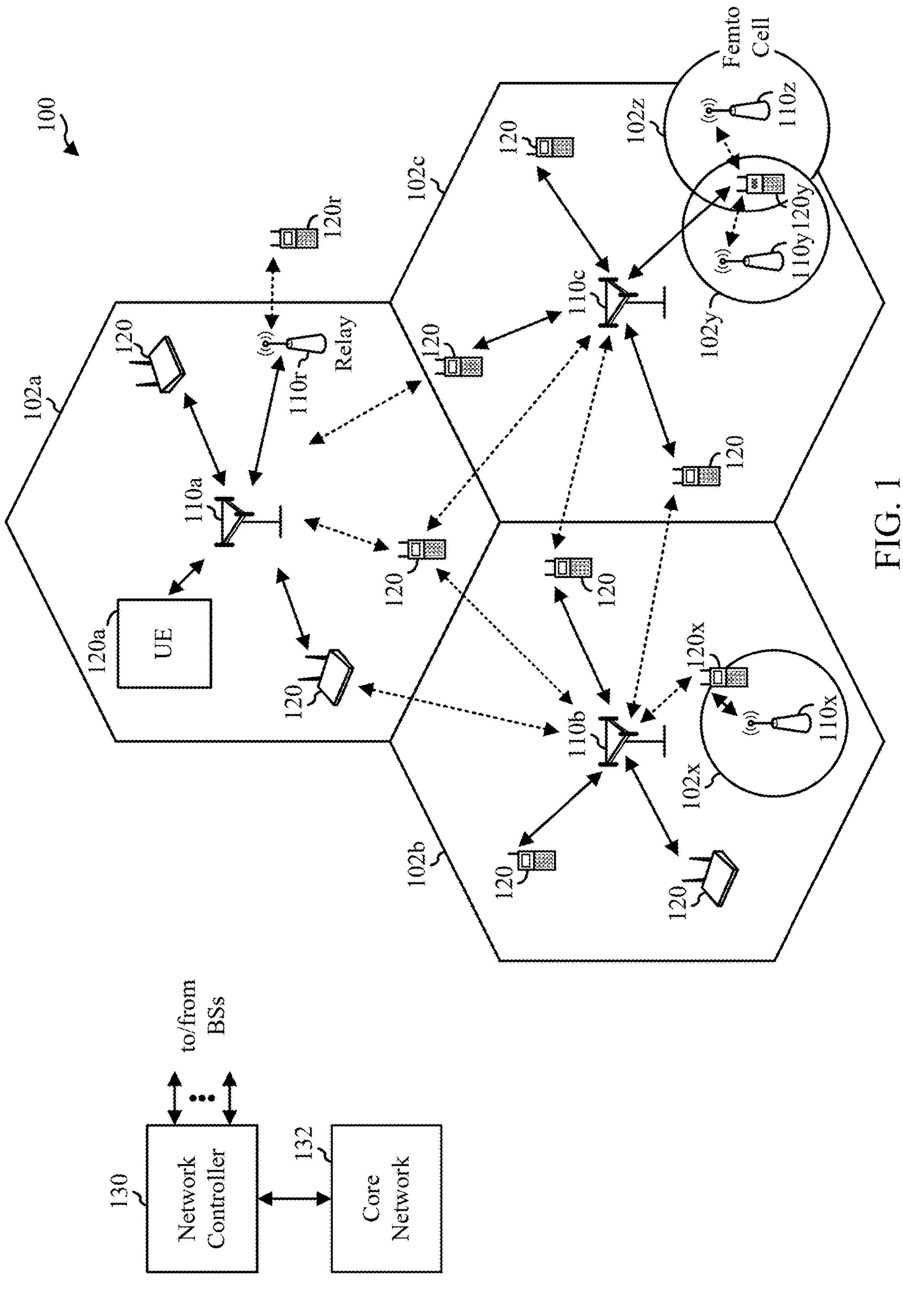
FIG. 1 is a diagram of an example wireless communications network, in which aspects of the present disclosure may be practiced.

Certain aspects of the present disclosure are directed towards techniques and apparatus for digital-to-analog conversion. For example, an incremental analog-to-digital converter (IADC) may be used to perform measurements to identify a direct current (DC) offset of a digital-to-analog converter (DAC). Based on the DC offset, a digital signal input to the DAC during mission mode may be adjusted to reduce the effect of the DC offset. In some aspects, the IADC may be implemented with a switch circuit for flipping the coupling between the differential outputs of the DAC and the differential inputs of the IADC. Two separate measurements may be performed by the IADC when the switch circuit is in a flip mode and a non-flip mode. The DC offset for the DAC may be calculated using the two separate measurements, canceling out (or at least reducing) the effect of any offset associated with the IADC on the DC offset measurement for the DAC, as described in more detail herein.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110*a-z* (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110*a*, 110*b*, and 110*c* may be macro BSs for the macro cells 102*a*, 102*b*, and 102*c*, respectively. The BS 110*x* may be a pico BS for a pico cell 102*x*. The BSs 110*y* and 110*z* may be femto BSs for the femto cells 102*y* and 102*z*, respectively. A BS may support one or multiple cells.

The BSs 110 communicate with one or more user equipment's (UEs) 120*a-y* (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120*x*, 120*y*, etc.) may be dispersed throughout the wireless communications network 100, and each UE 120 may be stationary or mobile. The wireless communications network 100 may also include relay stations (e.g., relay station 110*r*), also referred to as relays or the like, that receive a transmission of data and/or other information from an upstream station (e.g., a BS 110*a* or a UE 120*r*) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number $N_{ap}$ of antennas to achieve transmit diversity for downlink transmissions and/or receive diversity for uplink transmissions. A set $N_u$ of UEs 120 may receive downlink transmissions and transmit uplink transmissions. Each UE 120 may transmit user-specific data to and/or receive user-specific data from the BSs 110. In general, each UE 120 may be equipped with one or multiple antennas. The $N_u$ UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include a digital-to-analog converter (DAC) and an incremental analog-to-digital converter (IADC) used to make measurements to identify a direct current (DC) offset associated with the DAC, as described in more detail herein.

Figure 2:
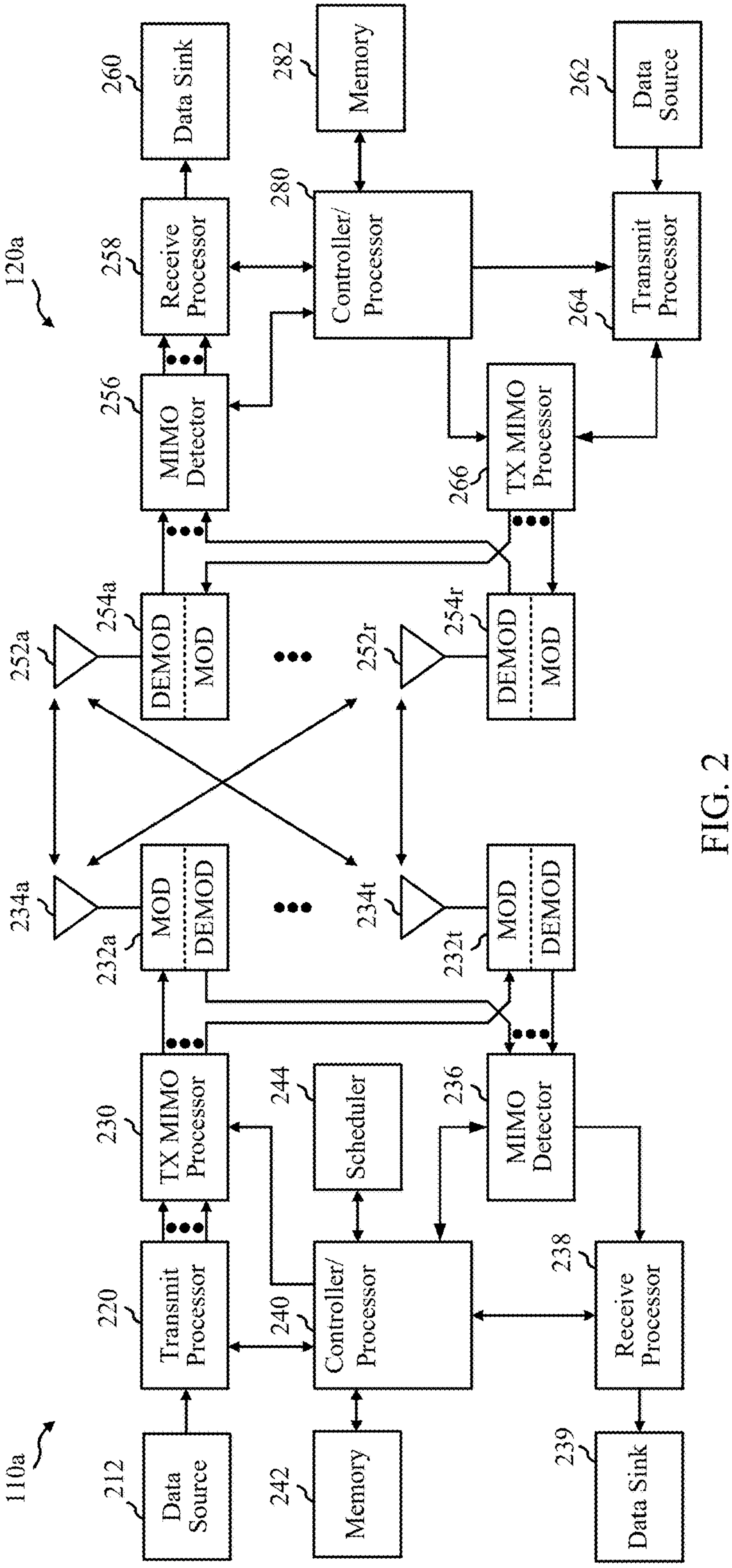
FIG. 2 is a block diagram conceptually illustrating a design of an example base station (BS) and user equipment (UE), in which aspects of the present disclosure may be practiced.

FIG. 2 illustrates example components of BS 110*a* and UE 120*a* (e.g., from the wireless communications network 100 of FIG. 1), in which aspects of the present disclosure may be implemented.

On the downlink, at the BS 110*a*, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232*a*-232*t*. Each modulator in transceivers 232*a*-232*t* may process a respective output symbol stream (e.g., for orthogonal frequency division multiplexing (OFDM), etc.) to obtain an output sample stream. Each of the transceivers 232*a*-232*t* may further process (e.g., convert to analog, amplify, filter, and upconvert) the output sample stream to obtain a downlink signal. Downlink signals from the transceivers 232*a*-232*t* may be transmitted via the antennas 234*a*-234*t*, respectively.

At the UE 120*a*, the antennas 252*a*-252*r* may receive the downlink signals from the BS 110*a* and may provide received signals to the transceivers 254*a*-254*r*, respectively. The transceivers 254*a*-254*r* may condition (e.g., filter, amplify, downconvert, and digitize) a respective received signal to obtain input samples. Each demodulator (DEMOD) in the transceivers 232*a*-232*t* may further process the input samples (e.g., for OFDM, etc.) to obtain received symbols. A MIMO detector 256 may obtain received symbols from all the demodulators in transceivers 254*a*-254*r*, perform MIMO detection on the received symbols if applicable, and provide detected symbols. A receive processor 258 may process (e.g., demodulate, deinterleave, and decode) the detected symbols, provide decoded data for the UE 120*a* to a data sink 260, and provide decoded control information to a controller/processor 280.

On the uplink, at UE 120*a*, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254*a*-254*r* (e.g., for single-carrier frequency division multiplexing (SC-FDM), etc.), and transmitted to the BS 110*a*. At the BS 110*a*, the uplink signals from the UE 120*a* may be received by the antennas 234, processed by the demodulators in transceivers 232*a*-232*t*, detected by a MIMO detector 236 if applicable, and further processed by a receive processor 238 to obtain decoded data and control information sent by the UE 120*a*. The receive processor 238 may provide the decoded data to a data sink 239 and the decoded control information to the controller/processor 240.

The memories 242 and 282 may store data and program codes for BS 110*a* and UE 120*a*, respectively. The memories 242 and 282 may also interface with the controllers/processors 240 and 280, respectively. A scheduler 244 may schedule UEs for data transmission on the downlink and/or uplink.

In certain aspects of the present disclosure, the transceivers 232 and/or the transceivers 254 may include a DAC and an IADC used to make measurements to identify a DC offset associated with the DAC, as described in more detail herein.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs).

Example RF Transceiver

Figure 3:
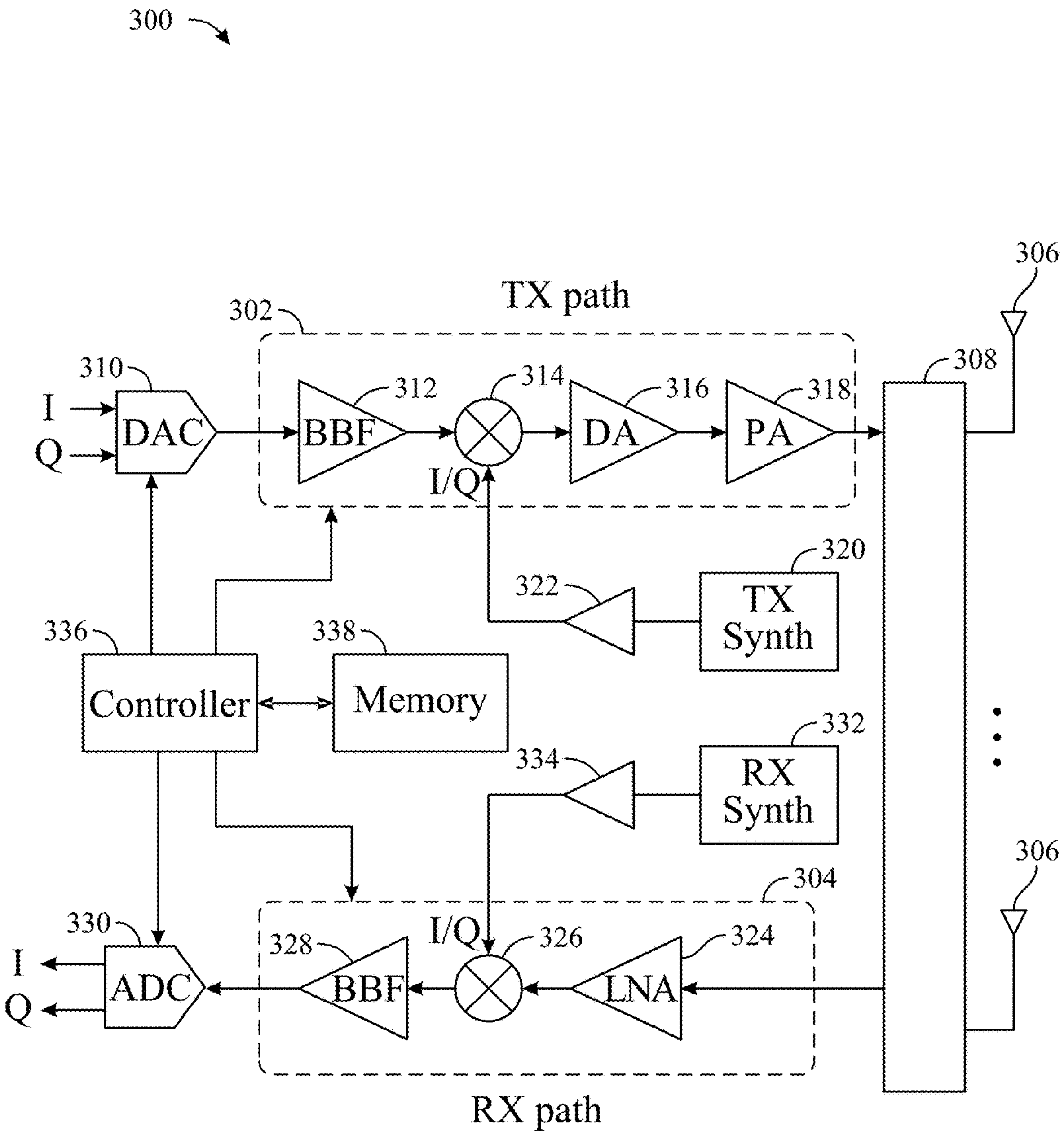
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC. In some aspects, an IADC may be used to make measurements to identify a DC offset associated with the DAC 310, as described in more detail herein.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for any of various other suitable systems.

Example Techniques for Digital-to-Analog Conversion

A current-steering digital-to-analog converter (DAC) is commonly used as the DAC structure for a transmit chain because such a DAC operates efficiently at a high conversion speed. The DAC output is in the form of a differential current in this case. The direct current (DC) offset of the DAC affects certain performance specifications, such as carrier suppression (CARSUP) and local oscillator (LO) leakage. The CARSUP specification is becoming more stringent; thus, reducing the DC offset of the DAC may help meet this specification. One way of reducing the DC offset is to increase the transistor and resistor sizes associated with the DAC. However, this manner of reducing DC offset would cause the DAC area to increase significantly.

Some implementations use repeated most-significant bit (MSB) current cell calibration to detect the DC offset and calibrate the DAC. However, using repeated MSB current cell calibration may be insufficient to meet CARSUP specifications. Moreover, performing multiple calibrations increases test time and cost. Certain aspects of the present disclosure are directed toward techniques for performing calibration to reduce the effect of a DC offset of a DAC in a manner that has little to no impact on the mission mode of the DAC.

Figure 4:
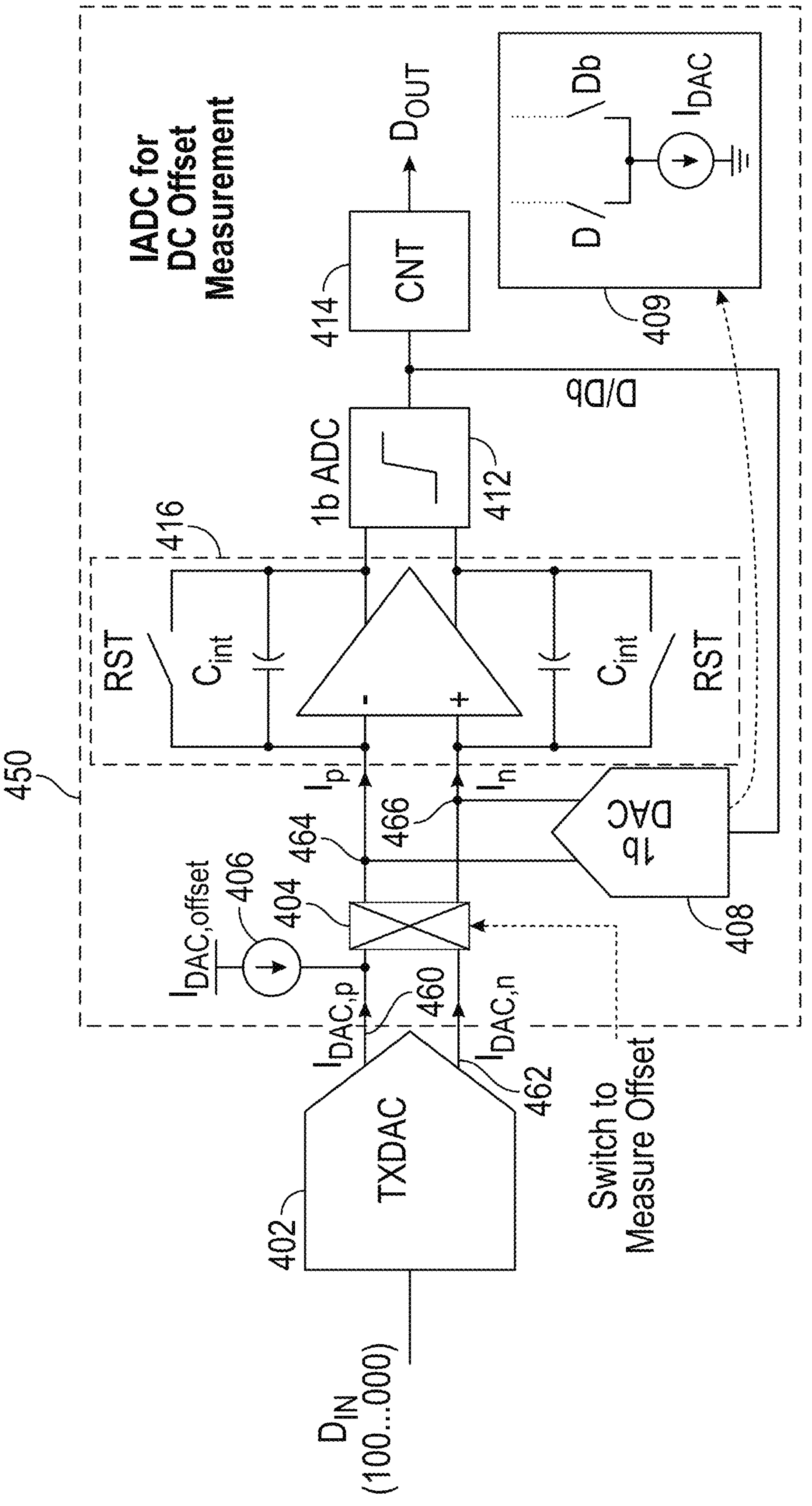
FIG. 4 illustrates an example digital-to-analog converter (DAC) and an incremental analog-to-digital converter (IADC) for direct current (DC) offset measurement, in accordance with certain aspects of the present disclosure.

FIG. 4 illustrates an example DAC 402 (e.g., a DAC for a transmit chain labeled "TXDAC," such as the DAC 310 described with respect to FIG. 3) and an incremental analog-to-digital converter (IADC) 450 for DC offset measurement, in accordance with certain aspects of the present disclosure. The outputs (e.g., differential outputs) of the DAC 402 may be coupled to respective differential inputs of the IADC 450. The IADC 450 may be implemented using a delta-sigma modulator (e.g., perform analog-to-digital conversion using delta-sigma modulation). For example, the IADC 450 may include an integrator 416 having differential inputs coupled to respective differential inputs 464, 466 of the IADC 450. The integrator 416 may include an operational amplifier with a first capacitive element (labeled "$C_{int}$") coupled between a negative input and a positive output of the operational amplifier, and a second capacitive element (labeled "$C_{int}$") coupled between a positive input and a negative output of the operational amplifier. As shown, reset switches (labeled "RST") may be coupled in parallel with the first and second capacitive elements. The reset switches may be closed to discharge the first and second capacitive elements and reset the integrator 416.

A one-bit ADC 412 (labeled "1b ADC") (e.g., a comparator) may be coupled between a counter 414 (labeled "CNT") and the differential outputs of the integrator 416. The counter 414 generates a digital output ($D_{OUT}$) for the IADC. A one-bit DAC 408 (labeled "1b DAC") may be coupled between the output of the ADC 412 and inputs of the integrator 416, as shown. The 1*b* DAC 408 may be implemented using a current-steering cell 409. As shown, the current-steering cell 409 may include a current source (labeled "$I_{DAC}$") that selectively sinks current from inputs of the integrator using switches controlled by a digital signal (labeled "D") and a complementary digital signal (labeled "Db"), respectively. The digital signal (D) and the complementary digital signal (Db) are generated by the 1b ADC 412.

The IADC 450 may be used to measure an offset current (e.g., $I_{DAC,offset}$) associated with the DAC 402. The offset current may be represented by current source 406 in FIG. 4. In other words, when the data input signal (labeled "$D_{IN}$") for the DAC 402 is set to be equal to a middle code (mid code) (e.g., $D_{IN}$ is set to 100 . . . 000), a difference between a positive output current ($I_{DAC,p}$) and a negative output current ($I_{DAC,n}$) of the DAC 402 should be (e.g., ideally) equal to a resolution (a current ($I_{LSB}$) representing a least-significant bit (LSB)) of the DAC 402. However, due to the DC offset of the DAC 402, the difference between $I_{DAC,p}$ and $I_{DAC,n}$ may not be equal to the resolution of the DAC 402 by an amount equal to $I_{DAC,offset}$ represented in FIG. 4 by the current source 406.

In some aspects, the IADC 450 may include a switch circuit 404. The switch circuit 404 may selectively couple the positive output 460 of the DAC 402 (e.g., providing $I_{DAC,p}$) to either the negative input 466 or the positive input 464 of the IADC 450, and selectively couple the negative output 462 of the DAC 402 (e.g., providing $I_{DAC,n}$) to either the negative input 466 or the positive input 464 of the IADC 450. During a non-flip mode, the switch circuit 404 couples the positive output 460 of the DAC 402 to the positive input 464 of the IADC 450 and couples the negative output 462 of the DAC 402 to the negative input 466 of the IADC 450. During a flip mode, the switch circuit 404 couples the negative output 462 of the DAC 402 to the positive input 464 of the IADC 450 and couples the positive output 460 of the DAC 402 to the negative input 466 of the IADC 450.

As shown, the integrator 416 may receive a positive input current ($I_p$) at a first input of the integrator 416 from the input 464 and receive a negative input current $I_n$ at a second input of the integrator 416 from input 466. When in the non-flip mode, $I_p$ may be equal to $I_{DAC,p}+I_{DAC,offset}$, and $I_n$ may be equal to $I_{DAC,n}$. The differential input signal to the integrator 416 $(I_p-I_n)_{NFLIP}$ in non-flip mode may be equal to $I_{DAC,offset}+I_{LSB}$, where $I_{LSB}$ is the resolution (a current representing a LSB) of the DAC 402. When in flip-mode, $I_p$ may be equal to $I_{DAC,n}$, and $I_n$ may be equal to $I_{DAC,p}+I_{DAC,offset}$. The differential input signal to the integrator $(I_p-I_n)_{FLIP}$ in flip mode may be equal to $I_{DAC,offset}-I_{LSB}$.

Figure 5:
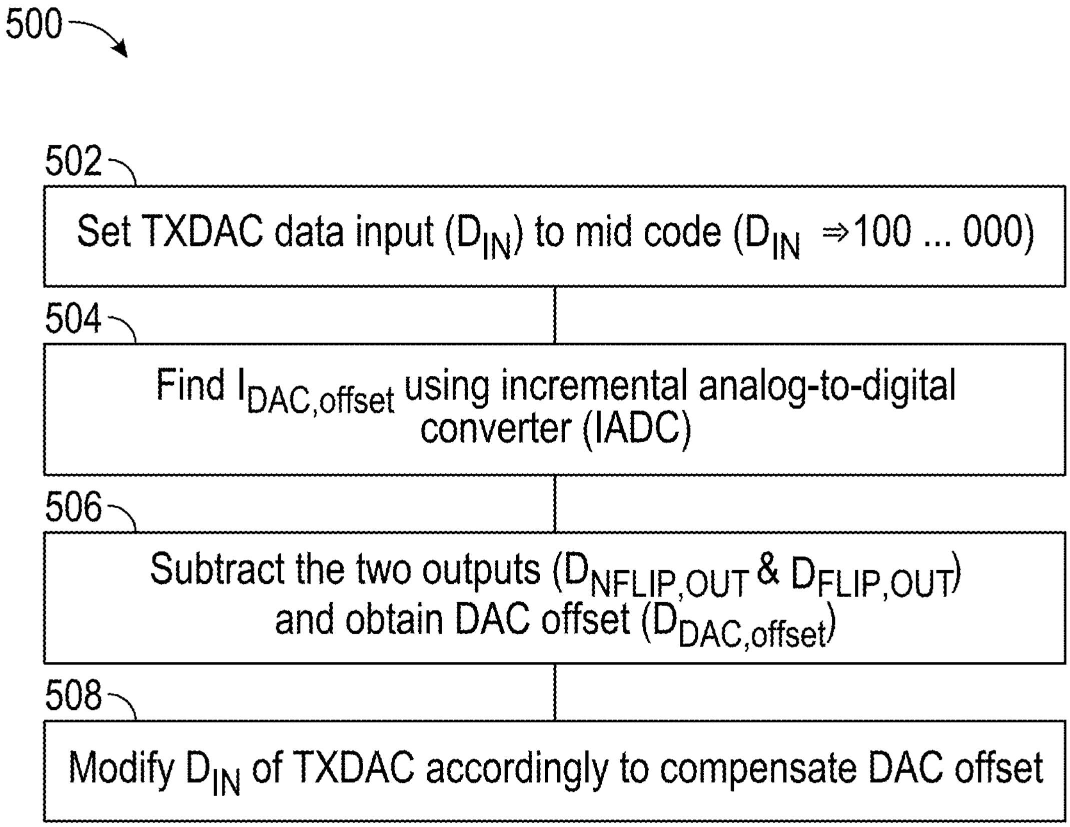
FIG. 5 is a flow diagram illustrating example operations for DC offset calibration, in accordance with certain aspects of the present disclosure.

FIG. 5 is a flow diagram illustrating example operations 500 for DC offset calibration, in accordance with certain aspects of the present disclosure. The operations 500 may be performed using a controller, such as the controller 240 or controller 280 of FIG. 2.

At block 502, the controller sets the data input signal (labeled "$D_{IN}$" in FIG. 4) for the DAC 402 to be equal to a middle code (mid code). For example, the $D_{IN}$ may be set to 100 . . . 000. With the data input signal being set to the mid code, the difference between the differential output currents ($I_{DAC,p}$ and $I_{DAC,n}$) of the DAC 402 should be equal to the resolution of the DAC without any DC offset, as described.

At block 504, the controller calculates (e.g., finds) $I_{DAC,offset}$ using measurements from the IADC 450. The calculation of the $I_{DAC,offset}$ may be performed using measurements made during non-flip and flip modes of the switch circuit 404.

Figure 6A:
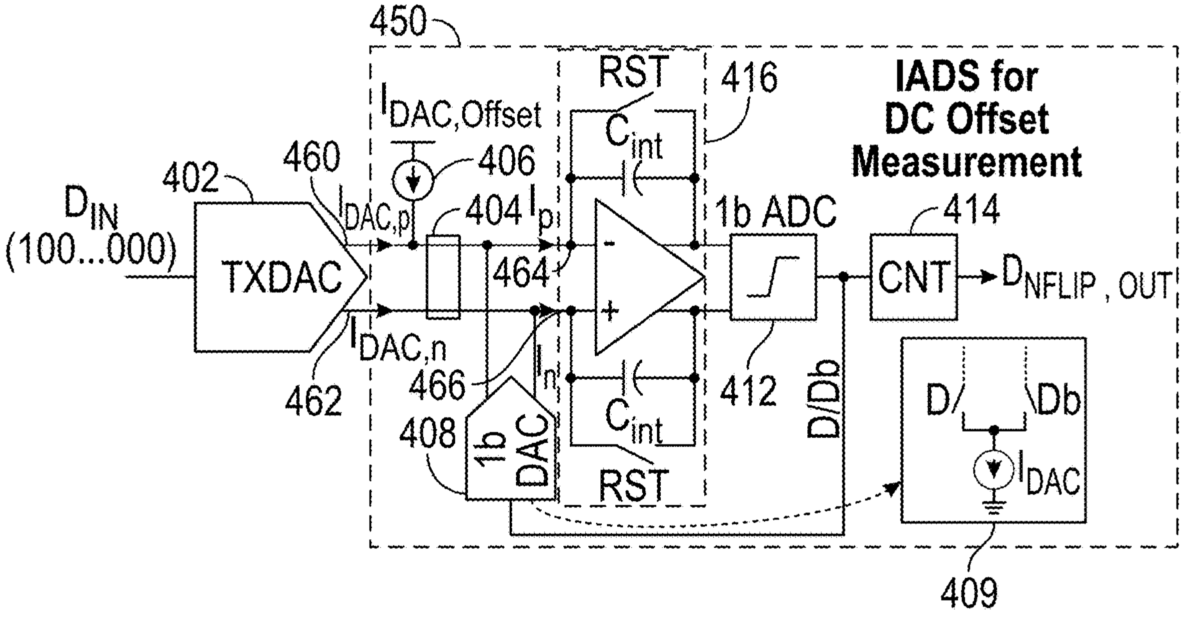
FIG. 6A illustrates an IADC in a non-flip mode, in accordance with certain aspects of the present disclosure.

FIG. 6A illustrates the IADC 450 in a non-flip mode, in accordance with certain aspects of the present disclosure. The switch circuit 404 may be configured in the non-flip mode to perform a non-flip operation. During the non-flip mode, the switch circuit 404 couples the positive output 460 of the DAC 402 to the positive input 464 of the IADC 450 and couples the negative output 462 of the DAC 402 to the negative input 466 of the IADC 450, as shown. During the non-flip operation, the differential output current of the DAC 402 is provided as input to the IADC 450 for conversion to a digital output ($D_{NFLIP,OUT}$). The switch circuit 404 may then be configured in a flip mode to perform a flip operation.

Figure 6B:
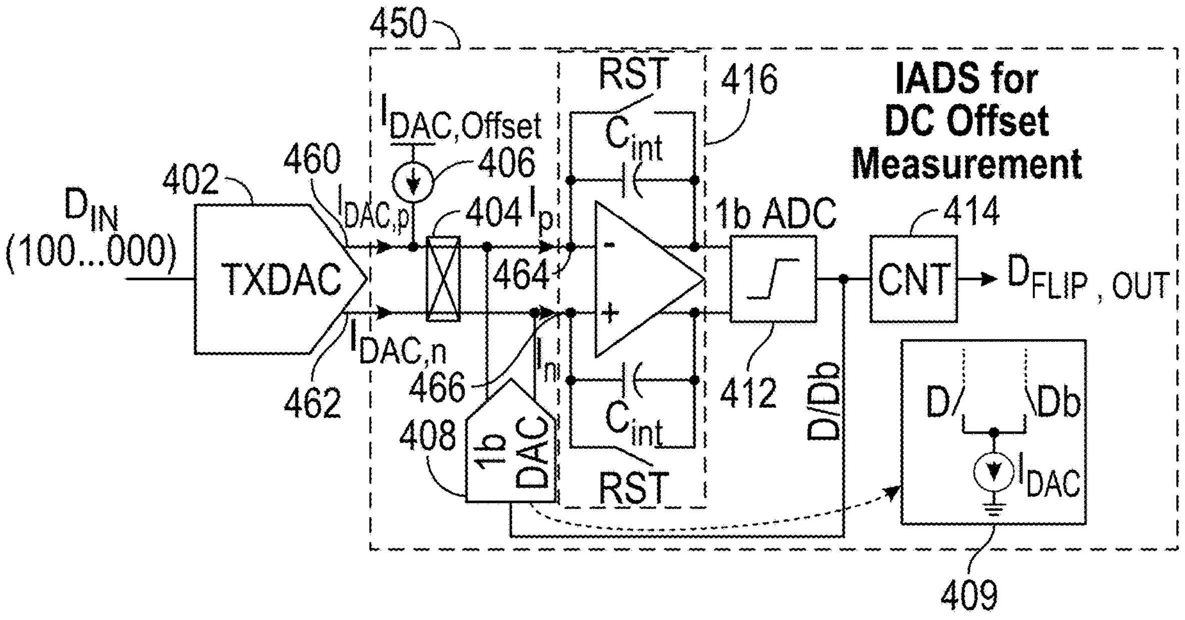
FIG. 6B illustrates an IADC in a flip mode, in accordance with certain aspects of the present disclosure.

FIG. 6B illustrates the IADC 450 in a flip mode, in accordance with certain aspects of the present disclosure. During the flip mode, the switch circuit 404 couples the negative output 462 of the DAC 402 to the positive input 464 of the IADC 450 and couples the positive output 460 of the DAC 402 to the negative input 466 of the IADC 450. During the flip operation, the differential output current of the DAC is inverted and used as the input to the IADC 450. For example, $I_{DAC,p}$ may be provided to the negative input 466, and $I_{DAC,n}$ may be provided to the positive input 464. As shown, the IADC 450 then converts the inverted differential output to a digital signal ($D_{FLIP,OUT}$).

The DAC offset current $I_{DAC,offset}$ may be calculated based on the following equation:

$$[(I_p-I_n)_{NFLIP}-(I_p-I_n)_{FLIP}]/2-I_{LSB}=I_{DAC,offset}$$

Referring back to FIG. 5, at block 506, the controller generates a digital DAC offset signal ($D_{DAC,offset}$) per the following equation:

$$D_{DAC,offset} = \frac{(D_{NFLIP,OUT} - D_{FLIP,OUT})/4 - 1}{2}$$

At block 508, the controller modifies DI for the DAC 402 during mission mode based on $D_{DAC,offset}$ to compensate for (or at least reduce) the effect of the DAC offset. For example, if $D_{DAC,offset}$ is equal to 3, the controller may subtract 3 from $D_{IN}$ for every digital input code during mission mode. For example, if the digital input signal before calibration ($D_{IN,before\_calibration}$) is equal to 100 . . . 000, then the digital input signal after calibration ($D_{IN,after\_calibration}$) may be equal to 011 . . . 101, given a $D_{DAC,offset}$ of 3. Performing the DC offset measurements with flip and non-flip modes as described herein effectively cancels out (e.g., or at least reduces) the impact of any DC offset associated with the IADC 450 itself on the DC offset measurement for the DAC 402, providing a more accurate measurement of the DC offset for the DAC 402.

Using the differential current outputs ($I_{DAC,p}$ and $I_{DAC,n}$) of the DAC 402 to perform the DC offset measurement may involve using capacitive elements ($C_{int}$) for the integrator 416, a large current source ($I_{DAC}$) for the current-steering cell 409, and may result in a long measurement process (e.g., the IADC measurement process may take $2\times2^{TXDAC,b}$ cycles, where TXDAC,b represents the resolution of the DAC 402). For example, if the DAC 402 is a 10-bit DAC, the IADC 450 may use $2\times2^{10}$ cycles for each DC offset measurement. Certain aspects are directed to techniques for reducing the size of the integrator capacitive elements ($C_{int}$), reducing the size of the current source ($I_{DAC}$) for the current-steering cell 409, and reducing the duration of the measurement process, as described in more detail with respect to FIG. 7.

Figure 7:
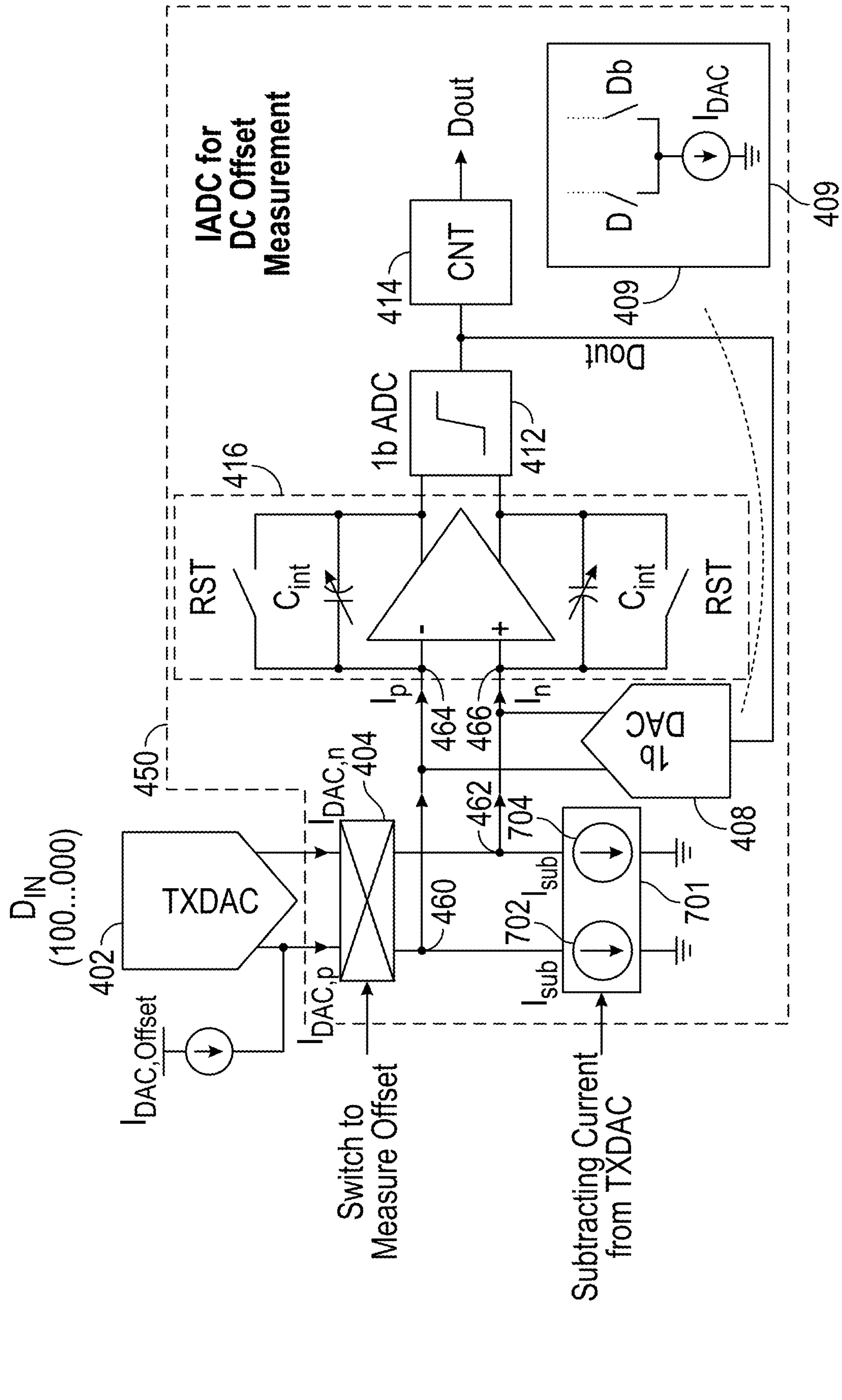
FIG. 7 illustrates an example IDAC for DC offset measurement using current sinking, in accordance with certain aspects of the present disclosure.

FIG. 7 illustrates an IADC 450 for DC offset measurement using current sinking, in accordance with certain aspects of the present disclosure. The IADC 450 may include a current source circuit 701. The current source circuit 701 may include current sources 702, 704 that sink currents from respective positive output 460 and negative output 462. The current sources 702, 704 may sink the same current $I_{sub}$, in some aspects. Thus, an equal amount of current $I_{sub}$ may be subtracted from both the differential current outputs of the DAC 402. $I_{sub}$ may be equal to $(I_{FS}-\alpha I_{LSB})/2$ to reduce the current sent to IADC 450 to $\alpha\times I_{LSB}$, $I_{FS}$ being the full-scale current of the DAC 402 (e.g., $I_{DAC,p}+I_{DAC,n}$). $\alpha$ may be set to be equal to $2^N$, where N is a positive integer less than TXDAC,b. For example, if TXDAC,b is 10 for a 10-bit DAC 402, then N may be set to be equal to an integer less than 10 (e.g., 7). In this manner, the size of the integrator capacitive elements ($C_{int}$), the size of the current source ($I_{DAC}$) of the current-steering cell 409, and the processing time of IADC 450 for DC offset measurements may be reduced by $2^{(TXDAC,b-N)}$. With the implementation described with respect to FIG. 7, the overall operation/calculation to obtain the DAC DC offset remains the same as described with respect to FIG. 5.

Any noise associated with the DAC 402 and IADC 450 may be canceled over time and may not impact the DC offset measurements. As shown, the IADC 450 is separate from the DAC 402 and may have little to no impact on the operation of the DAC 402 during mission mode. No modification to the DAC 402 may be performed for the DC offset measurement techniques described herein. Having the IADC separate from the DAC 402 allows for evaluating the DC offset both using automated test equipment (ATE) and in the factory.

The IADC 450 may be shared to calibrate the DC offset for multiple DACs, such as a DAC for an in-phase (I) path, a DAC for a quadrature (Q) path, a DAC for a 45° offset in-phase (I45) path, and a DAC for a 45° offset quadrature (Q45) path of a transmitter. For instance, as shown in FIG. 4, the DAC 402 may represent N DAC(s), N being a positive integer. The DACs may be selectively coupled to the IADC 450 for DC offset calibration.

Figure 8A:
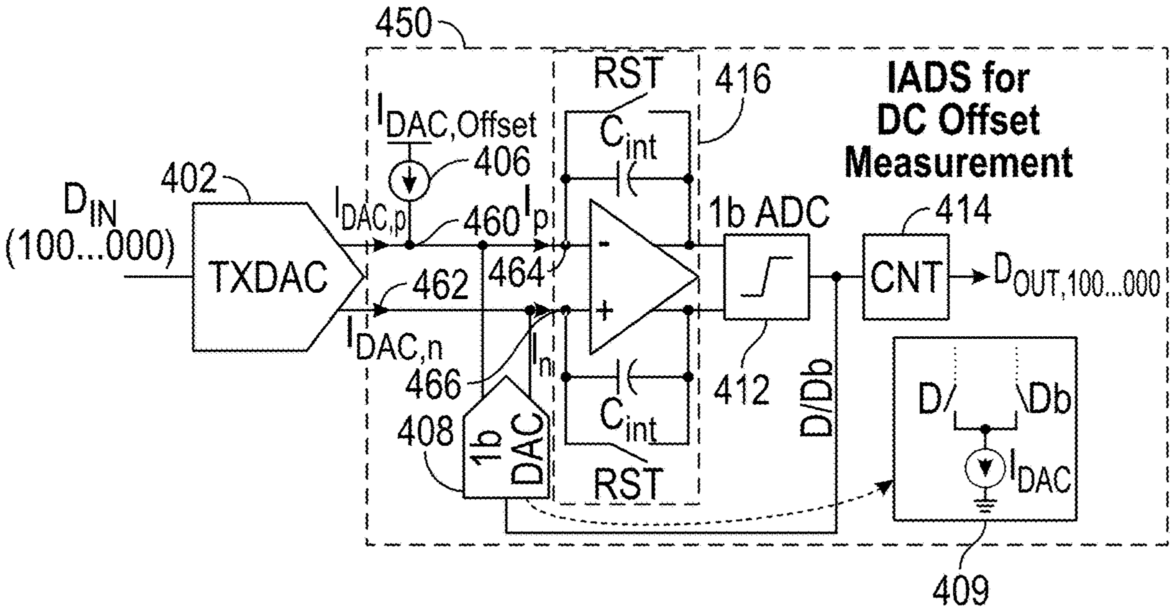
FIGS. 8A and 8B illustrate an IADC without a switch circuit, in accordance with certain aspects of the present disclosure.
Figure 8B:
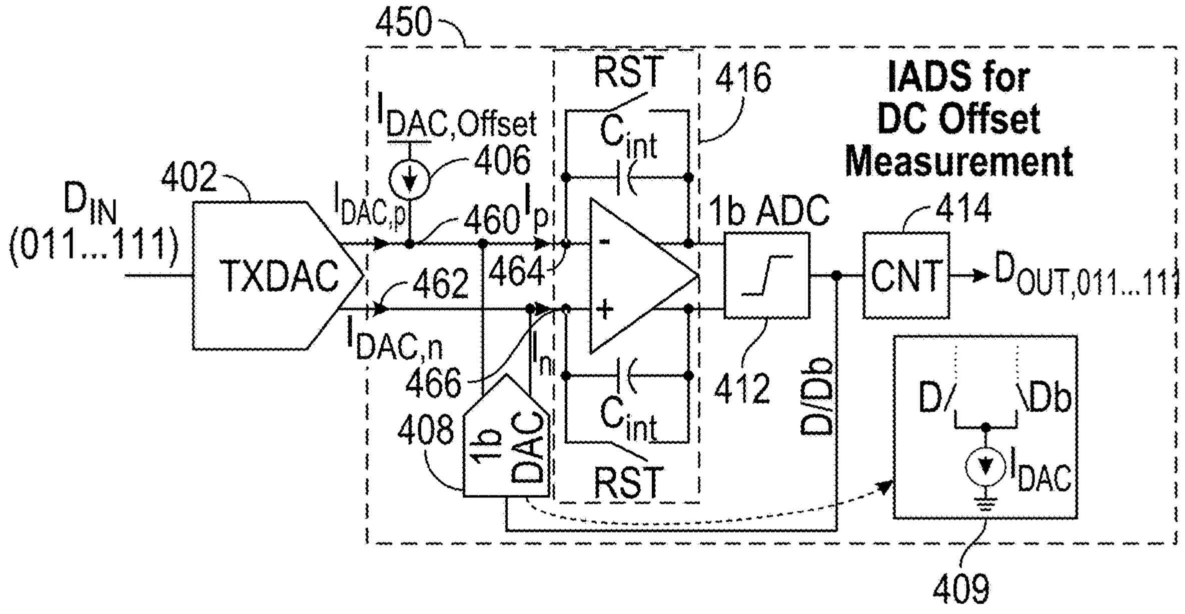

FIGS. 8A and 8B illustrate the IADC 450 without the switch circuit 404 and receiving two different values for $D_{IN}$, in accordance with certain aspects of the present disclosure. In this case, instead of flipping the differential outputs of DAC 402 (e.g., in flip and non-flip modes), the DC offset may be measured using two different values for $D_{IN}$, as described in more detail with respect to FIG. 9.

Figure 9:
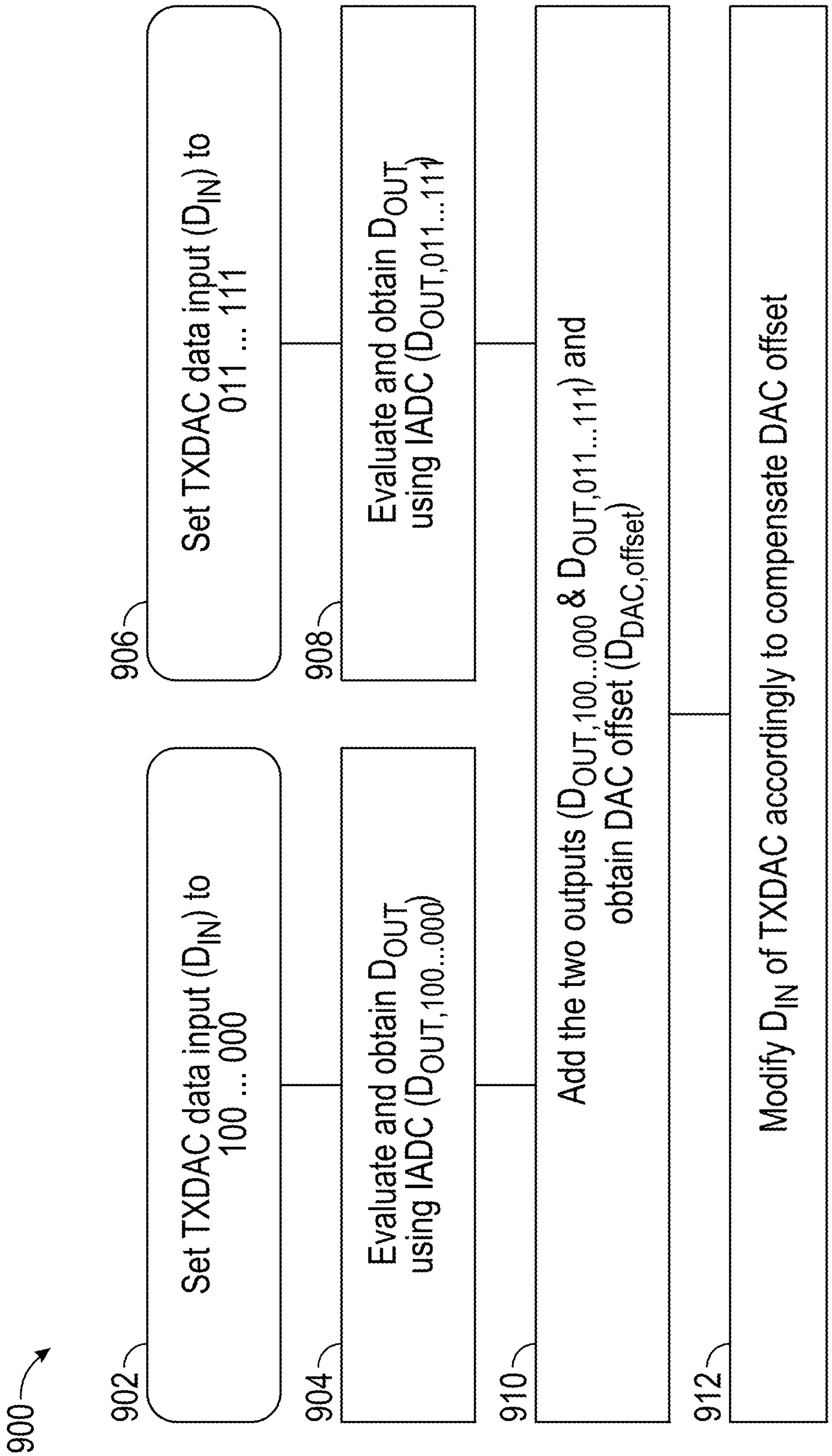
FIG. 9 is a flow diagram illustrating example operations for DC offset calibration, in accordance with certain aspects of the present disclosure.

FIG. 9 is a flow diagram illustrating example operations 900 for DC offset calibration without a switch circuit, in accordance with certain aspects of the present disclosure. The operations 900 may be performed by a controller, such as the controller 240 or controller 280 of FIG. 2.

At block 902, $D_{IN}$ may be set to the mid-code (e.g., 100 . . . 000), and at block 904, the IADC 450 may evaluate (e.g., perform analog-to-digital conversion) to generate a digital output signal $D_{OUT,100\ldots000}$, as shown in FIG. 8A. The controller may obtain the digital output signal $D_{OUT,100\ldots000}$. At block 906, $D_{IN}$ may be set to the mid-code minus one (011 . . . 111), and at block 908, the IADC 450 may evaluate (e.g., performing analog-to-digital conversion) to generate a digital output signal $D_{OUT,011\ldots111}$, as shown in FIG. 8B. The digital output signal $D_{OUT,011\ldots111}$ may be obtained by the controller. The $D_{IN}$ value of 100 . . . 000 should provide a DAC differential current $[I_{DAC,P}-I_{DAC,N}]$ representing $+I_{LSB}/2$ and the $D_{IN}$ value of 011 . . . 111 should provide a differential current $[I_{DAC,P}-I_{DAC,N}]$ representing $-I_{LSB}/2$, the addition of which should be zero without any DC offset (e.g., assuming an ideal DAC 402).

When $D_{IN}$ is set to 100 . . . 000, the positive output current of DAC 402 may be equal to $I_{DAC,p,100\ldots000}$ and $I_p$ may be equal to $I_{DAC,p,100\ldots000}+I_{DAC,offset}$. When $D_{IN}$ is set to 100 . . . 000, the negative output current of DAC 402 may be equal to $I_{DAC,n,100\ldots000}$ and $I_n$ may be equal to $I_{DAC,n,100\ldots000}$. Thus, the different input current $(I_p-I_n)_{100\ldots000}$ of the IADC 450 may be equal to $I_{DAC,offset}+I_{LSB}$. When $D_{IN}$ is set to 011 . . . 111, the positive output current of DAC 402 may be equal to $I_{DAC,p,011\ldots111}$, and $I_p$ may be equal to $I_{DAC,p,011\ldots111}+I_{DAC,offset}$. When $D_{IN}$ is set to 011 . . . 111, the negative output current of DAC 402 may be equal to $I_{DAC,n,011\ldots111}$, and $I_n$ may be equal to $I_{DAC,n,011\ldots111}$. Thus, the different input current $(I_p-I_n)_{011\ldots111}$ of the IADC 450 may be equal to $I_{DAC,offset}-I_{LSB}$. Thus, $I_{DAC,offset}$ may be calculated based on the following equation:

$$I_{DAC,offset} = [(I_p - I_n)_{100\ldots000} + (I_p - I_n)_{011\ldots111}]/2$$

To calculate the DC offset associated with DAC 402 at block 910, the controller may add the two digital output signals ($D_{OUT,100\ldots000}$ and $D_{OUT,011\ldots111}$) to obtain a DAC offset digital signal ($D_{DAC,offset}$) per the following equation:

$$D_{DAC,offset} = \frac{D_{OUT,100\ldots000} + D_{OUT,011\ldots111}}{8}$$

At block 912, the controller modifies $D_{IN}$ for the DAC 402 during mission mode based on $D_{DAC,offset}$ to compensate for (or at least reduce) the effect of the DAC offset (e.g., similar to block 508 of FIG. 5).

The DC offset calibration techniques described herein may correct (or at least reduce) the DC offset to a range of ±0.5 $I_{LSB}$. The hardware to implement the IADC 450 may be shared among different DACs for calibration.

Figure 10:
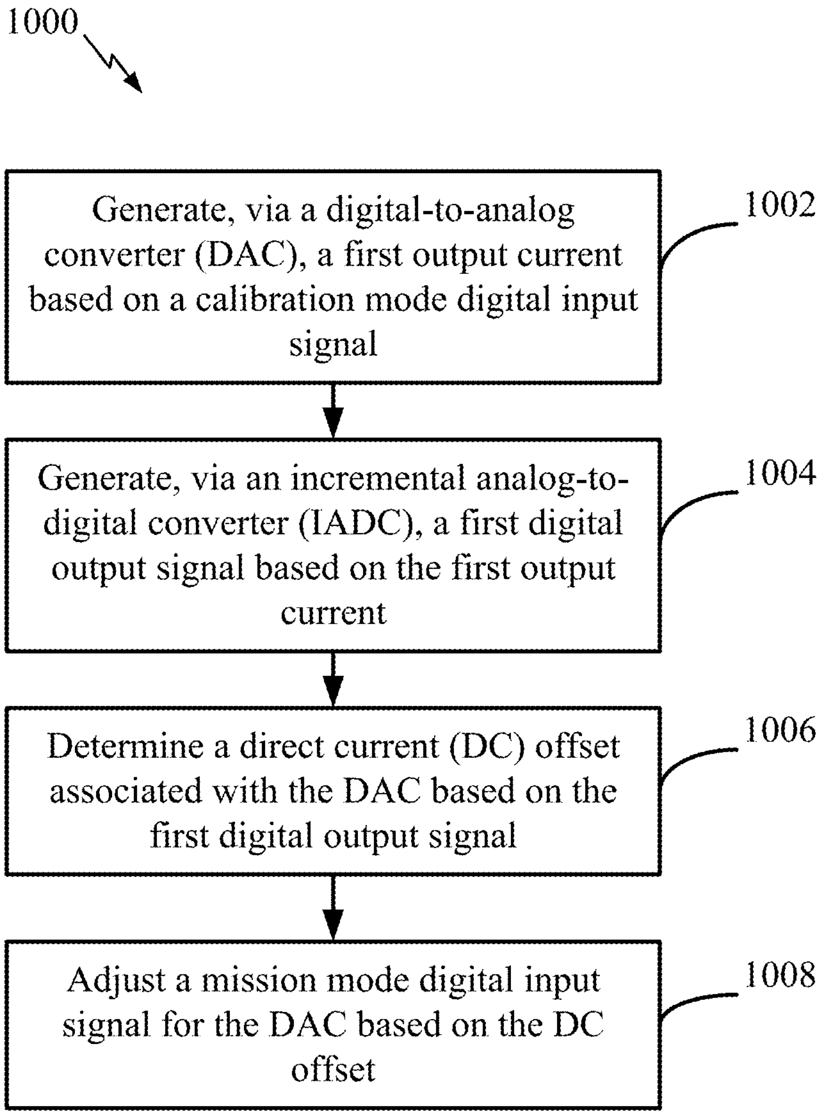
FIG. 10 is a flow diagram illustrating example operations for digital-to-analog conversion, in accordance with certain aspects of the present disclosure.

FIG. 10 is a flow diagram illustrating example operations 1000 for digital-to-analog conversion, in accordance with certain aspects of the present disclosure. The operations 1000 may be performed, for example, by a conversion circuit, such as the DAC 402, the IADC 450, and a controller (e.g., controller 240 or 280 of FIG. 2).

At block 1002, the conversion circuit may generate, via a DAC (e.g., DAC 402), a first output current (e.g., $I_{DAC,p}$) based on a calibration-mode digital input signal (e.g., $D_{IN}$ during a calibration mode). At block 1004, the conversion circuit may generate, via an IADC (e.g. IADC 450), a first digital output signal (e.g., $D_{OUT}$) based on the first output current.

At block 1006, the conversion circuit may determine a DC offset associated with the DAC based on the first digital output signal. At block 1008, the conversion circuit may adjust a mission-mode digital input signal (e.g., $D_{IN}$ during mission mode) for the DAC based on the DC offset.

In some aspects, the IADC may include a switch circuit (e.g., switch circuit 404 of FIG. 4) coupled to an output of the DAC. The conversion circuit may generate, via the IADC, a non-flip-mode digital output signal (e.g., $D_{NFLIP,OUT}$) based on the first output current of the DAC while the switch circuit is configured in non-flip mode. The conversion circuit may also generate, via the IADC, a flip-mode digital output signal (e.g., $D_{FLIP,OUT}$) based on a second output current of the DAC while the switch circuit is configured in flip mode. The DC offset may be determined based on the non-flip-mode digital output signal and the flip-mode digital output signal.

In some aspects, the conversion circuit may, in the non-flip mode, couple a first output (e.g., output 460 of FIG. 4) of the DAC to a first input (e.g., input 464) of the IADC and a second output (e.g., output 462) of the DAC to a second input (e.g., input 466) of the IADC using the switch circuit. The conversion circuit may, in the flip mode, couple the first output of the DAC to the second input of the IADC and the second output of the DAC to the first input of the IADC using the switch circuit. In some aspects, the conversion circuit may set the calibration-mode digital input signal of the DAC to a middle code. The non-flip-mode digital output signal and the flip-mode digital output signal may be generated while the calibration-mode digital input signal of the DAC is set to the middle code.

In some aspects, the conversion circuit may couple the IADC to another DAC after the DC offset associated with the DAC is determined. The conversion circuit may determine another DC offset associated with the other DAC using the IADC after the IADC is coupled to the other DAC.

In some aspects, the conversion circuit may sink a first current (e.g., via current source 702) from a first node coupled to a first input (e.g., input 464) of the IADC. The conversion circuit may also sink a second current (e.g., via current source 704) from a second node coupled to a second input (e.g., input 466) of the IADC. The first digital output signal may be generated while the first current and the second current are being sunk from the first input and the second input of the IADC, respectively. An amount of the first current (e.g., $I_{sub}$) may be the same as an amount of the second current (e.g., $I_{sub}$).

In some aspects, the conversion circuit may set the calibration-mode digital input signal of the DAC to a middle code. The first digital output signal ($D_{OUT,100 \ldots 000}$) may be generated based on the first output current of the DAC while the digital input signal is set to the middle code. The conversion circuit may set the digital input signal of the DAC to the middle code minus one, and generate a second digital output signal ($D_{OUT,011 \ldots 111}$) based on a second output current of the DAC while the digital input signal is set to the middle code minus one. The DC offset may be determined based on the first digital output signal and the second digital output signal.

Example Aspects

In addition to the various aspects described above, specific combinations of aspects are within the scope of the present disclosure, some of which are detailed below:

Aspect 1: An apparatus for digital-to-analog conversion, comprising: a digital-to-analog converter (DAC); an incremental analog-to-digital converter (IADC) having a first input coupled to a first output of the DAC; and a controller coupled to the DAC and the IADC, wherein the controller is configured to: determine a direct current (DC) offset associated with the DAC using the IADC; and control a mission-mode digital input signal of the DAC based on the DC offset.

Aspect 2: The apparatus of Aspect 1, wherein the IADC comprises a switch circuit coupled to the first output of the DAC.

Aspect 3: The apparatus of Aspect 2, wherein the switch circuit is configured to: in a non-flip mode, couple the first output of the DAC to the first input of the IADC and a second output of the DAC to a second input of the IADC; and in a flip mode, couple the first output of the DAC to the second input of the IADC and the second output of the DAC to the first input of the IADC.

Aspect 4: The apparatus of Aspect 3, wherein: the IADC is configured to: generate a non-flip-mode digital output signal based on a first output current of the DAC while the switch circuit is configured in the non-flip mode; and generate a flip-mode digital output signal based on a second output current of the DAC while the switch circuit is configured in the flip mode; and the controller is configured to determine the DC offset based on the non-flip-mode digital output signal and the flip-mode digital output signal.

Aspect 5: The apparatus of Aspect 4, wherein the controller is configured to set a calibration-mode digital input signal of the DAC to a middle code, and wherein the IADC is configured to generate the non-flip-mode digital output signal and the flip-mode digital output signal while the calibration-mode digital input signal of the DAC is set to the middle code.

Aspect 6: The apparatus according to any of Aspects 1-5, wherein the IADC is configured to perform analog-to-digital conversion using delta-sigma modulation.

Aspect 7: The apparatus according to any of Aspects 1-6, wherein: the IADC is configured to be coupled to another DAC after the DC offset associated with the DAC is determined; and the controller is configured to determine another DC offset associated with the other DAC using the IADC after the IADC is coupled to the other DAC.

Aspect 8: The apparatus according to any of Aspects 1-7, further comprising a current source circuit configured to: sink a first current from a first node coupled to the first input of the IADC; and sink a second current from a second node coupled to a second input of the IADC.

Aspect 9: The apparatus of Aspect 8, wherein an amount of the first current is the same as an amount of the second current.

Aspect 10: The apparatus according to any of Aspects 1-9, wherein: the controller is configured to set a calibration-mode digital input signal of the DAC to a middle code; the IADC is configured to generate a first digital output signal based on a first output current of the DAC while the calibration-mode digital input signal is set to the middle code; the controller is configured to set the calibration-mode digital input signal of the DAC to the middle code minus one; the IADC is configured to generate a second digital output signal based on a second output current of the DAC while the calibration-mode digital input signal is set to the middle code minus one; and the controller is configured to determine the DC offset based on the first digital output signal and the second digital output signal.

Aspect 11: A method for digital-to-analog conversion, comprising: generating, via a digital-to-analog converter (DAC), a first output current based on a calibration-mode digital input signal; generating, via an incremental analog-to-digital converter (IADC), a first digital output signal based on the first output current; determining a direct current (DC) offset associated with the DAC based on the first digital output signal; and adjusting a mission-mode digital input signal for the DAC based on the DC offset.

Aspect 12: The method of Aspect 11, wherein the IADC comprises a switch circuit coupled to an output of the DAC.

Aspect 13: The method of Aspect 12, further comprising: generating, via the IADC, a non-flip-mode digital output signal based on the first output current of the DAC while the switch circuit is configured in a non-flip mode; and generating, via the IADC, a flip-mode digital output signal based on a second output current of the DAC while the switch circuit is configured in a flip mode, wherein the DC offset is determined based on the non-flip-mode digital output signal and the flip-mode digital output signal.

Aspect 14: The method of Aspect 13, further comprising: in the non-flip mode, coupling a first output of the DAC to a first input of the IADC and a second output of the DAC to a second input of the IADC using the switch circuit; and in the flip mode, coupling the first output of the DAC to the second input of the IADC and the second output of the DAC to the first input of the IADC using the switch circuit.

Aspect 15: The method of Aspect 13 or 14, further comprising setting the calibration-mode digital input signal of the DAC to a middle code, wherein the non-flip-mode digital output signal and the flip-mode digital output signal are generated while the calibration-mode digital input signal of the DAC is set to the middle code.

Aspect 16: The method according to any of Aspects 11-15, further comprising: coupling the IADC to another DAC after the DC offset associated with the DAC is determined; and determining another DC offset associated with the other DAC using the IADC after the IADC is coupled to the other DAC.

Aspect 17: The method according to any of Aspects 11-16, further comprising: sinking a first current from a first node coupled to a first input of the IADC; and sinking a second current from a second node coupled to a second input of the IADC, wherein the first digital output signal is generated while the first current and the second current are being sunk from the first input and the second input of the IADC, respectively.

Aspect 18: The method of Aspect 17, wherein an amount of the first current is the same as an amount of the second current.

Aspect 19: The method according to any of Aspects 11-18, further comprising: setting the calibration-mode digital input signal of the DAC to a middle code, wherein the first digital output signal is generated based on the first output current of the DAC while the calibration-mode digital input signal is set to the middle code; setting the calibration-mode digital input signal of the DAC to the middle code minus one; and generating a second digital output signal based on a second output current of the DAC while the calibration-mode digital input signal is set to the middle code minus one, wherein the DC offset is determined based on the first digital output signal and the second digital output signal.

Aspect 20: An apparatus for digital-to-analog conversion, comprising: a digital-to-analog converter (DAC) including a first output and a second output; and an incremental analog-to-digital converter (IADC) including a switch circuit, a first input selectively coupled to the first output of the DAC or the second output of the DAC via the switch circuit, and a second input selectively coupled to the first output of the DAC or the second output of the DAC via the switch circuit.

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. An apparatus for digital-to-analog conversion, comprising:
- a digital-to-analog converter (DAC);
- an incremental analog-to-digital converter (IADC) having a first input coupled to a first output of the DAC; and
- a controller coupled to the DAC and the IADC, wherein the controller is configured to:
  - determine a direct current (DC) offset associated with the DAC using the IADC; and
  - control a digital input signal of the DAC based on the DC offset.

2. The apparatus of claim 1, wherein the IADC comprises a switch circuit coupled to the first output of the DAC.

3. The apparatus of claim 2, wherein the switch circuit is configured to:
- in a non-flip mode, couple the first output of the DAC to the first input of the IADC and a second output of the DAC to a second input of the IADC; and
- in a flip mode, couple the first output of the DAC to the second input of the IADC and the second output of the DAC to the first input of the IADC.

4. The apparatus of claim 3, wherein:
- the IADC is configured to:
  - generate a non-flip-mode digital output signal based on a first output current of the DAC while the switch circuit is configured in the non-flip mode; and
  - generate a flip-mode digital output signal based on a second output current of the DAC while the switch circuit is configured in the flip mode; and
- the controller is configured to determine the DC offset based on the non-flip-mode digital output signal and the flip-mode digital output signal.

5. The apparatus of claim 4, wherein the controller is configured to set a calibration-mode digital input signal of the DAC to a middle code, and wherein the IADC is configured to generate the non-flip-mode digital output signal and the flip-mode digital output signal while the calibration-mode digital input signal of the DAC is set to the middle code.

6. The apparatus of claim 1, wherein the IADC is configured to perform analog-to-digital conversion using delta-sigma modulation.

7. The apparatus of claim 1, wherein:
- the IADC is configured to be coupled to another DAC after the DC offset associated with the DAC is determined; and
- the controller is configured to determine another DC offset associated with the other DAC using the IADC after the IADC is coupled to the other DAC.

8. The apparatus of claim 1, further comprising a current source circuit configured to:
- sink a first current from a first node coupled to the first input of the IADC; and
- sink a second current from a second node coupled to a second input of the IADC.

9. The apparatus of claim 8, wherein an amount of the first current is the same as an amount of the second current.

10. The apparatus of claim 1, wherein:
- the controller is configured to set a calibration-mode digital input signal of the DAC to a middle code;
- the IADC is configured to generate a first digital output signal based on a first output current of the DAC while the calibration-mode digital input signal is set to the middle code;
- the controller is configured to set the calibration-mode digital input signal of the DAC to the middle code minus one;
- the IADC is configured to generate a second digital output signal based on a second output current of the DAC while the calibration-mode digital input signal is set to the middle code minus one; and
- the controller is configured to determine the DC offset based on the first digital output signal and the second digital output signal.

11. A method for digital-to-analog conversion, comprising:
- generating, via a digital-to-analog converter (DAC), a first output current based on a calibration-mode digital input signal;
- generating, via an incremental analog-to-digital converter (IADC), a first digital output signal based on the first output current;
- determining a direct current (DC) offset associated with the DAC based on the first digital output signal; and
- adjusting a digital input signal for the DAC based on the DC offset.

12. The method of claim 11, wherein the IADC comprises a switch circuit coupled to an output of the DAC.

13. The method of claim 12, further comprising:
- generating, via the IADC, a non-flip-mode digital output signal based on the first output current of the DAC while the switch circuit is configured in a non-flip mode; and
- generating, via the IADC, a flip-mode digital output signal based on a second output current of the DAC while the switch circuit is configured in a flip mode, wherein the DC offset is determined based on the non-flip-mode digital output signal and the flip-mode digital output signal.

14. The method of claim 13, further comprising:
- in the non-flip mode, coupling a first output of the DAC to a first input of the IADC and a second output of the DAC to a second input of the IADC using the switch circuit; and
- in the flip mode, coupling the first output of the DAC to the second input of the IADC and the second output of the DAC to the first input of the IADC using the switch circuit.

15. The method of claim 13, further comprising setting the calibration-mode digital input signal of the DAC to a middle code, wherein the non-flip-mode digital output signal and the flip-mode digital output signal are generated while the calibration-mode digital input signal of the DAC is set to the middle code.

16. The method of claim 11, further comprising:
- coupling the IADC to another DAC after the DC offset associated with the DAC is determined; and
- determining another DC offset associated with the other DAC using the IADC after the IADC is coupled to the other DAC.

17. The method of claim 11, further comprising:
- sinking a first current from a first node coupled to a first input of the IADC; and
- sinking a second current from a second node coupled to a second input of the IADC, wherein the first digital output signal is generated while the first current and the second current are being sunk from the first input and the second input of the IADC, respectively.

18. The method of claim 17, wherein an amount of the first current is the same as an amount of the second current.

19. The method of claim 11, further comprising:

setting the calibration-mode digital input signal of the DAC to a middle code, wherein the first digital output signal is generated based on the first output current of the DAC while the calibration-mode digital input signal is set to the middle code;

setting the calibration-mode digital input signal of the DAC to the middle code minus one; and generating a second digital output signal based on a second output current of the DAC while the calibration-mode digital input signal is set to the middle code minus one, wherein the DC offset is determined based on the first digital output signal and the second digital output signal.

20. An apparatus for digital-to-analog conversion, comprising:

a digital-to-analog converter (DAC) including a first output and a second output; and an incremental analog-to-digital converter (IADC) including a switch circuit, a first input selectively coupled to the first output of the DAC or the second output of the DAC via the switch circuit, and a second input selectively coupled to the first output of the DAC or the second output of the DAC via the switch circuit, wherein the switch circuit is configured to:

in a non-flip mode, couple the first output of the DAC to the first input of the IADC and a second output of the DAC to a second input of the IADC; and in a flip mode, couple the first output of the DAC to the second input of the IADC and the second output of the DAC to the first input of the IADC.

* * * * *